(12) United States Patent
Phoon et al.

(10) Patent No.: US 7,279,907 B2
(45) Date of Patent: Oct. 9, 2007

(54) METHOD OF TESTING FOR POWER AND GROUND CONTINUITY OF A SEMICONDUCTOR DEVICE

(75) Inventors: Wai Khuin Phoon, Selangor (MY); Vivien Wong, Selangor (MY); Wah Yew Tan, Kuala Lumpur (MY)

(73) Assignee: Freescale Semiconductor, Inc., Austin, TX (US)

( * ) Notice: Subject to any disclaimer, the term of this patent is extended or adjusted under 35 U.S.C. 154(b) by 117 days.

(21) Appl. No.: 11/364,792

(22) Filed: Feb. 28, 2006

(65) Prior Publication Data

US 2007/0200586 A1    Aug. 30, 2007

(51) Int. Cl.
*G01R 27/28* (2006.01)
(52) U.S. Cl. ........................ 324/628; 324/613; 324/614
(58) Field of Classification Search ................ 324/628, 324/627
See application file for complete search history.

(56) References Cited

U.S. PATENT DOCUMENTS

| 5,280,237 | A | 1/1994 | Buks |
| 5,498,964 | A | 3/1996 | Kerschner et al. |
| 5,521,513 | A | 5/1996 | Stringer |
| 5,554,928 | A | 9/1996 | Stringer |
| 5,557,209 | A | 9/1996 | Crook et al. |
| 5,736,862 | A * | 4/1998 | Hamblin ................. 324/527 |
| 6,002,247 | A * | 12/1999 | Watkins ................. 324/66 |
| 6,188,235 | B1 | 2/2001 | Buks et al. |
| 6,545,497 | B2 | 4/2003 | Hebert et al. |
| 6,785,628 | B2 | 8/2004 | Corr |
| 2005/0035754 | A1 | 2/2005 | Ho et al. |
| 2005/0099186 | A1 | 5/2005 | Parker et al. |

FOREIGN PATENT DOCUMENTS

| GB | 2407877 A | 11/2005 |
| JP | 2000-171510 A | 6/2000 |
| WO | WO 2004/040324 A2 | 5/2004 |

* cited by examiner

*Primary Examiner*—Ha Tran Nguyen
*Assistant Examiner*—Richard Isla-Rodas
(74) *Attorney, Agent, or Firm*—Charles Bergere

(57) ABSTRACT

A method of testing for power and ground continuity of a semiconductor device having Input and Output (IO) pins and at least a pair of power and ground pins includes identifying the power and ground pins of the device. A victim pin is selected from the IO pins of the device for each pair of the power and ground pins, and an aggressor pin for each victim pin is selected from the remaining IO pins. The aggressor pins are toggled between a high state and a low state. A level of switching noise on each victim pin is measured, and the measured levels of switching noise are compared with predetermined data to determine power and ground continuity of the device.

20 Claims, 3 Drawing Sheets

METHOD OF TESTING FOR POWER AND GROUND CONTINUITY OF A SEMICONDUCTOR DEVICE

BACKGROUND OF THE INVENTION

The present invention relates generally to continuity testing and, in particular, to a method of testing for power and ground continuity of a semiconductor device.

Interconnection faults such as, for example, missing wire bonds, wire bond lifting, missing solder balls, and ball bond lifting are a source of package defects. Continuity testing is performed to identify and screen out semiconductor devices with interconnection faults. Conventional load boards, typically designed and fabricated for parametric and functional testing, are not suitable for power and ground continuity testing. Consequently, power and ground continuity testing is carried out using either modified or customized load boards. However, there are considerable costs associated with the use of such customized or modified load boards. Hence, it would be desirable to have a method of performing power and ground continuity testing for a semiconductor device using a conventional load board.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements.

DETAILED DESCRIPTION OF THE INVENTION

Figure 1:
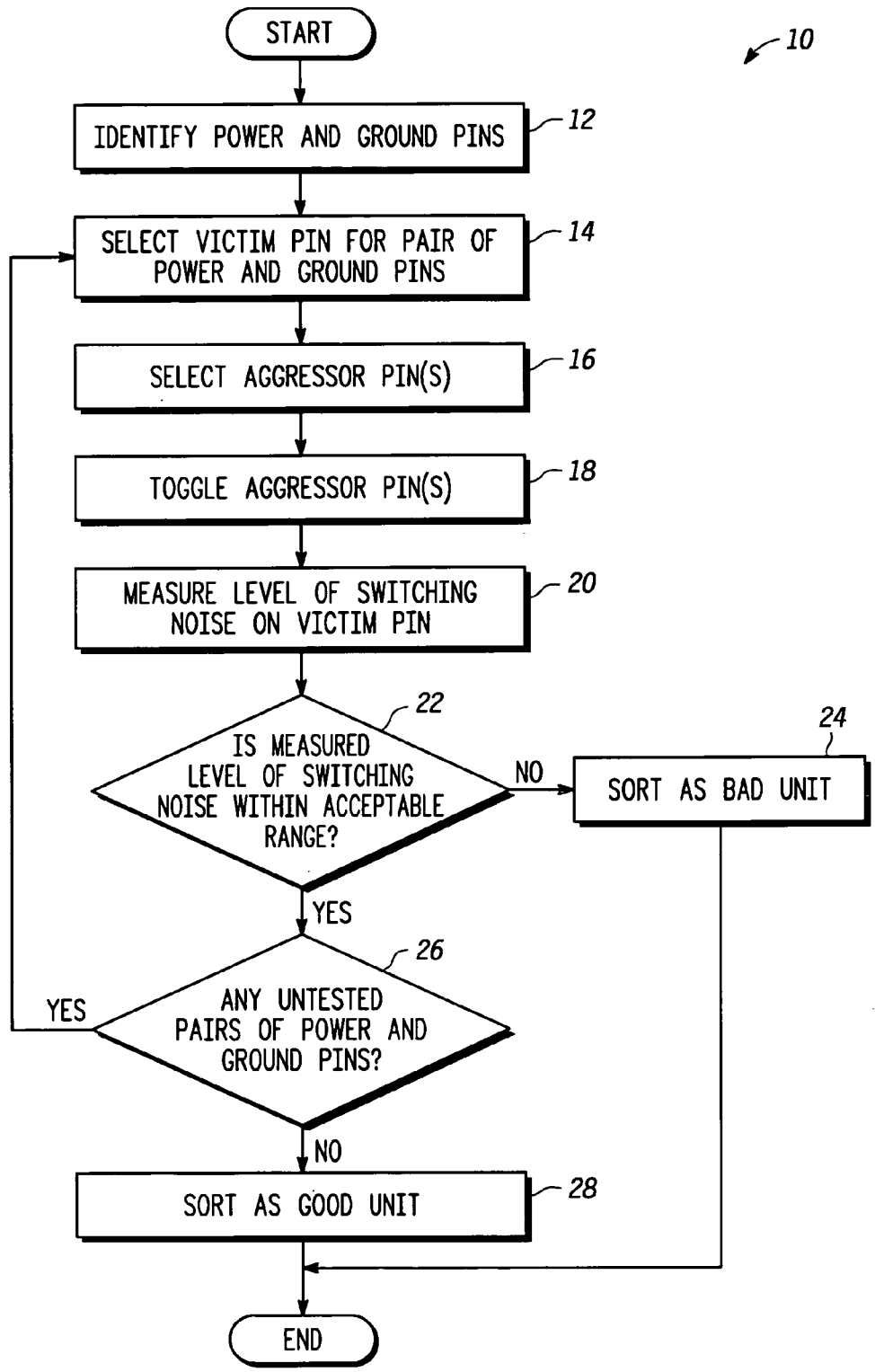
FIG. 1 is a flowchart depicting a method of testing for power and ground continuity of a semiconductor device in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method of testing for power and ground continuity of a semiconductor device. The device includes a plurality of Input and Output (IO) pins and at least a pair of power and ground pins. The method includes identifying the power and ground pins. A victim pin is selected from the IO pins for each of the power and ground pins, and at least one aggressor pin for each victim pin is selected from the remaining IO pins. The aggressor pins are toggled between a first state and a second state. A level of switching noise on each victim pin is measured, and the measured levels of switching noise are compared with predetermined data to determine power and ground continuity of the device.

The present invention also provides a method of testing for power and ground continuity of a semiconductor device having a plurality of Input and Output (IO) pins and at least a pair of power and ground pins. The method includes the steps of identifying the power and ground pins, and selecting victim pins from the IO pins for each of the ground and power pins. In one embodiment, the power and ground pins are paired and a victim pin is selected for each pair of power and ground pins. At least one aggressor pin is selected from the remaining IO pins. The aggressor pin is toggled between a first state and a second state (e.g., high to low). The level of switching noise on the victim pin is measured, and the measured level of switching noise is compared with predetermined data to determine continuity of the pair of power and ground pins. The steps of selecting the victim and aggressor pins, toggling the at least one aggressor pin, measuring the level of switching noise on the victim pin and comparing the measured level of switching noise with predetermined data are repeated for each identified pair of power and ground pins.

The present invention further provides a computer readable medium tangibly embodying a program of instructions for power and ground continuity testing of a semiconductor device. The program is to be stored in a memory and executed by a processor. The device includes a plurality of Input and Output (IO) pins and at least a pair of power and ground pins. The program includes instructions to identify the power and ground pins. Additionally, the program includes instructions to select a victim pin from the IO pins of the device for each of the power and ground pins, and instructions to select at least one aggressor pin from the remaining IO pins for each victim pin. The program also includes instructions to toggle the aggressor pins between a high state and a low state, instructions to measure a level of switching noise on each victim pin, and instructions to compare the measured levels of switching noise with predetermined data to determine power and ground continuity of the device.

Switching noise appears as an added positive or negative voltage on the signal trace of a quiet IO pin of a semiconductor device, and is induced on the quiet IO pin when another IO pin is toggled between a first state and a second state, such as between a high state and a low state. Specifically, when an IO pin of a semiconductor device is toggled between a high state and a low state, a time varying current is induced, which in turn induces a change in voltage level, otherwise known as switching noise, on a quiet IO pin. Experiments conducted by the inventors show that the level of switching noise on a quiet IO pin of a semiconductor device with an interconnection fault differs from that on a quiet IO pin of a known good semiconductor device. Accordingly, the present invention makes use of the difference in the level of switching noise on the quiet IO pin to detect the presence of an interconnection fault in a semiconductor device. Because switching noise levels can be directly measured from the IO pins of a semiconductor device, the present invention provides a method of testing for power and ground continuity of a semiconductor device using a conventional load board. That is, a separate, customized load board or a modified one is no longer needed for performing power and ground continuity testing with the present invention. The present invention may be implemented on conventional Digital/Mixed-signal Automated Test Equipment (ATE) as such ATE are capable of measuring signal amplitudes. Further, the present invention may be implemented as a package level test, and may be applied to leaded package products such as, for example, a Quad Flat Pack (QFP) package, with multiple power and ground pins, as well as to Ball Grid Array (BGA) packages.

Referring now to FIG. 1, a flowchart depicting a method 10 of testing for power and ground continuity of a semiconductor device in accordance with an embodiment of the present invention is shown. The device includes a plurality of Input and Output (IO) pins and at least a pair of power and ground pins. A typical semiconductor device tested using the method of the present invention includes multiple power and ground pins.

The power and ground pins of the device are identified at step 12. That is, as the pin-out of the device under test (DUT) is known, the pin-out information is programmed into the ATE, as well understood by those of skill in the art. Next, victim pins are selected from the IO pins of the device at step 14 for each of the power and ground pins. That is, respective victim pins are selected for respective power and ground pins. In one embodiment of the invention, the power and ground pins are paired and one victim pin is selected for each of such pairs. Although any of the IO pins of the device can serve as the victim or quiet IO pin, IO pins adjacent to the respective power and ground pins are preferably selected as the victim pins at step 14. This is because the IO pins adjacent the power and ground pins are most affected by an interconnection fault in the latter, and hence the difference in the level of switching noise on the victim pin is more noticeable and easily picked up on these IO pins.

After selecting the victim pins, at least one aggressor pin is selected from the remaining IO pins at step 16. In a preferred embodiment, the selected aggressor and victim pins share the same ground or power pin internally in the DUT because the noise method of detection is predominantly ground bounce noise instead of crosstalk noise. The victim pin and the at least one aggressor pin for the respective power and ground pins may share a same port of the ATE. The at least one aggressor pin is toggled between a first state and a second state such as low to high, at step 18, while the victim pin is held at a fixed state, that is, either the high state or the low state. The level of switching noise on the victim pin, preferably, the maximum switching noise level, is measured at step 20. The measured level of switching noise is compared with predetermined data at step 22 to determine continuity of the power and ground pins. If the measured switching level noise is greater than a predetermined vale, the device is sorted as a bad unit at step 24. If the measured level of switching noise is within an acceptable range (less than a predetermined value or within a predetermined range), a check is performed at step 26 to determine whether there are any untested power and ground pins in the device. If the check performed at step 26 indicates that there are no untested power and ground pins in the device, the device is sorted as a good unit at step 28. Otherwise, steps 14 to 22 are repeated until each identified power and ground pin has been tested.

The predetermined data comprises switching noise measurements from at least one known good semiconductor device, and is obtained by performing simulations on known good semiconductor devices. A simulation is performed by inserting a known good semiconductor device into a test socket of a load board, identifying the power and ground pins of the known good device, and selecting a victim pin for each identified power and ground pin (or identified pairs of power and ground pins) and at least one aggressor pin for each victim pin. The at least one aggressor pin is toggled while the victim pin is held at a fixed state, and a level of switching noise on each victim pin is measured. The switching noise measurements from the known good semiconductor device are used in the derivation of the acceptable range of switching noise values for a good unit. Because the level of switching noise varies depending on the type of semiconductor device undergoing continuity testing and the location of the test site on the load board, the simulation is repeated at different sites on the load board and for different types of semiconductor devices. The switching noise measurements from the simulations are used to derive acceptable ranges of switching noise values for specific types of semiconductor devices at specific locations on the load board. These ranges are input into a test program for power and ground continuity testing of semiconductor devices. To obtain a more accurate range of switching values for each type of semiconductor device, the simulation for a particular type of semiconductor device is repeated on a number of known good semiconductor devices of that type. For example, the simulations may be performed on known good semiconductor devices from five (5) different wafer lots.

As is evident from FIG. 1, a victim pin is selected for each of the power and ground pins (or each pair of the power and ground pins) of the device, while at least one aggressor pin is selected from the remaining IO pins for each victim pin. The measured level of switching noise on each victim pin is compared with predetermined data to determine power and ground continuity of the device.

Because the level of switching noise on each victim pin is amplified by the toggling of greater numbers of aggressor pins, a plurality of aggressor pins preferably is selected at step 16 for each victim pin. The difference in the level of switching noise is made more apparent when greater numbers of aggressor pins are toggled. Accordingly, in one embodiment, all the remaining IO pins of the device are toggled at step 18. For greater amplification of the switching noise level, the selected aggressor pins are toggled substantially simultaneously by toggling each ATE port sequentially until all the selected aggressor pins are toggled. This is done especially for CPU based integrated circuits that may not be able to toggle more than one port (set of pins whose state is definable from same register) at a time. For example, the selected aggressor pins in a first port may be toggled, followed by those in a second port, until all the selected aggressor pins are toggled. The time taken to assert the ATE ports is very short, thus, although the ports are toggled sequentially, the effect is that the aggressor pins are switched substantially simultaneously.

The level of switching noise on the victim pin is measured at step 20 when the at least one aggressor pin is toggled from either the high-to-low state or the low-to-high state. However, it is preferable to measure the level of switching noise on the victim pin when the at least one aggressor pin is toggled from the high state to the low state because the level of switching noise on the victim pin is higher, and the difference in the level of switching noise more apparent, at the falling edge of the aggressor pin signal.

The method 10 shown in FIG. 1 is performed when a semiconductor device to be tested, also known as the device under test (DUT), is inserted into a test socket of a conventional load board. To minimise the incidence of reflections, which could potentially obscure the effects of switching noise on the victim pin signal, the victim and aggressor pins may be terminated with a terminating resistor having a resistance that matches a trace impedance of the load board on which the semiconductor device is tested. For example, the victim and aggressor pins are terminated with a 51 ohm terminating resistor when the board trace impedance is 51 ohm. The board trace impedance can be measured with the help of a Time Domain Reflectometry Scope or modelled by performing a signal integrity simulation using Hyperlynx software, which is available from Mentor Graphics Corporation of San Jose, Calif. Alternatively, the load board may be impedance controlled by design. That is, the board is designed in a manner to eliminate or reduce reflectance.

The method described above may be implemented in software as a program of instructions that are stored in a memory and executed by a processor. The program is tangibly embodied in a computer readable medium, and includes a plurality of instructions that, when executed, causes the processor to perform the functions of the method described. The processor is operably coupled to the computer readable medium and retrieves the plurality of instructions for execution. The program of instructions may be embodied on one or more of computer hard disks, floppy disks, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media.

Figure 2:
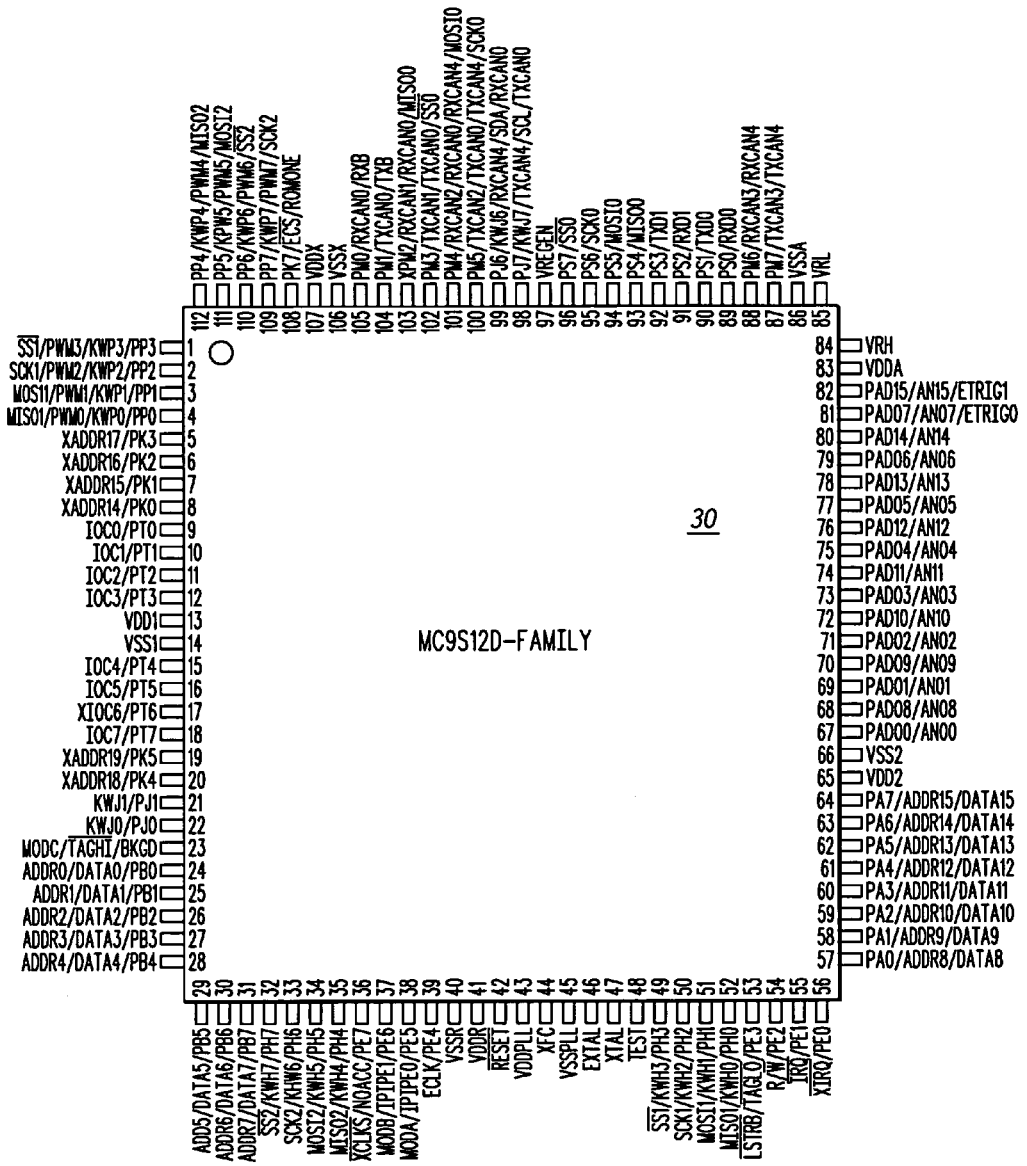
FIG. 2 is a schematic top plan view of a semiconductor device on which the method of testing for power and ground continuity illustrated in FIG. 1 is performed.

An exemplary embodiment of the present invention will now be described with reference to FIGS. 2 to 4. FIG. 2 is a top plan view of one particular device tested using the method of the present invention. In this case, the device is a MC9S12D-family microprocessor 30 available from Freescale Semiconductor, Inc. of Austin, Tex. The microprocessor 30 includes four (4) power pins, namely VDD1, VDDR, VDD2 and VDDX (i.e., pins 13, 41, 65 and 107, respectively), and four (4) ground pins, namely VSS1, VSSR, VSS2 and VSSX (i.e., pins 14, 40, 66 and 106, respectively).

Figure 3:
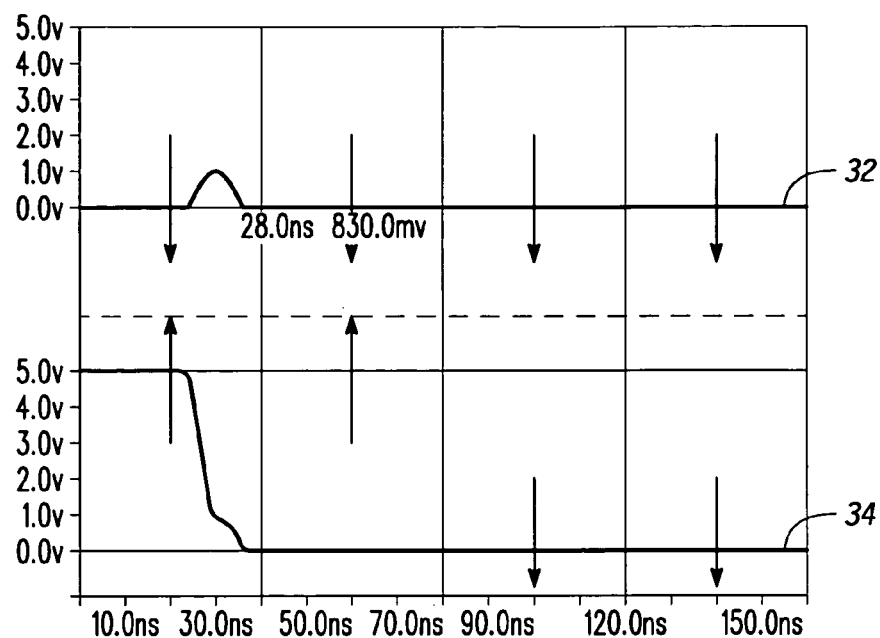
FIG. 3 is a waveform diagram illustrating the level of switching noise on a victim pin of a known good semiconductor.
Figure 4:
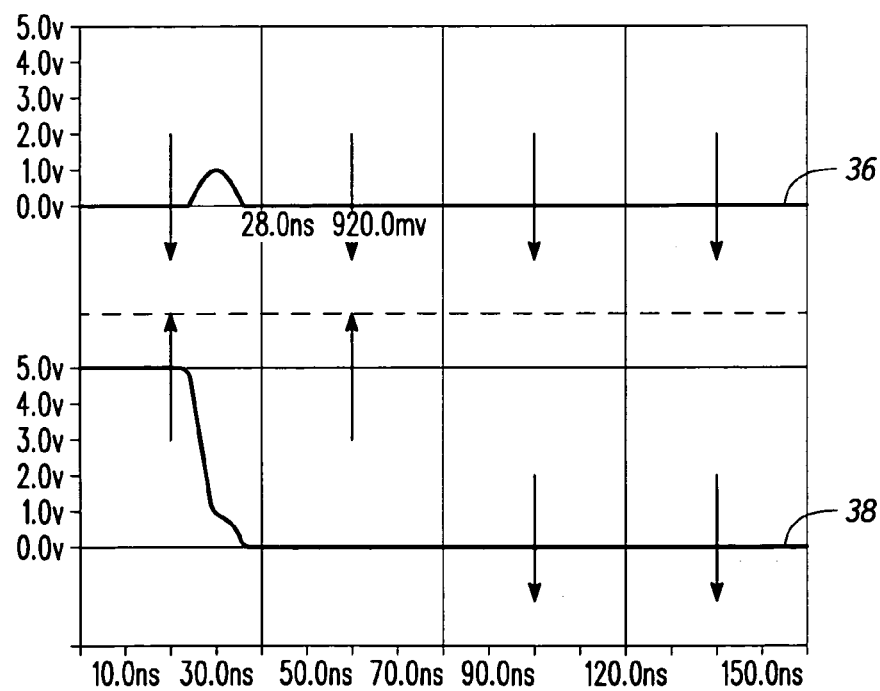
FIG. 4 is a waveform diagram illustrating the level of switching noise on a victim pin of a semiconductor device.

FIGS. 3 and 4 are waveform diagrams obtained from a digital waveform display of an Automated Test Equipment (ATE). Referring now to FIG. 3, a waveform diagram illustrating the level of switching noise on a victim pin of a known good semiconductor device is shown. The waveform diagram of FIG. 3 was obtained from a test performed on the known good device. Two (2) signals are shown in FIG. 3: a first signal 32 shows the voltage level on the victim pin and the second signal 34 shows the voltage level on a selected aggressor pin.

In this test, the IO pin PM0 (i.e., pin 105) adjacent the power and ground pair VDDX and VSSX (i.e., pins 107 and 106, respectively) was selected as the victim pin, and the IO pins PM1 and PM2 (i.e., pins 104 and 103, respectively) were selected as the aggressor pins. In the test, the victim pin PM0 and the aggressor pins PM1 and PM2 shared the same DUT port. The victim pin PM0 was held at a low state of 0 volts (V), while the aggressor pins PM1 and PM2 were toggled substantially simultaneously between a high state of 5 V and the low state of 0 V. As shown in FIG. 3, the level of switching noise on the victim pin PM0 was measured when the aggressor pins PM1 and PM2 were toggled from the high state to the low state. A maximum switching noise level of 830.0 millivolts (mV) was measured on the victim pin PM0 of the known good device (at time 28.0 nSec). Similar measurements were taken for other respective victim pins PT4, PE4 and PA7 (i.e., pins 15, 39 and 64, respectively) selected for each of the other three pairs of power and ground pins, namely, VDD1 and VSS1, VDDR and VSSR, and VDD2 and VSS2. The test was repeated on a plurality of known good semiconductor devices of the same type, but from different wafer lots. An acceptable range of switching noise values was determined based on the measured levels of switching noise for each of the victim pins. These ranges are shown in Table 1 below.

TABLE 1

| POWER AND GROUND PAIR | VICTIM PIN | ACCEPTABLE RANGE OF SWITCHING NOISE |
|---|---|---|
| VDD1 and VSS1 (pins 13 and 14) | PT4 (pin 15) | <1000 mV |
| VDDR and VSSR (pins 40 and 41) | PE4 (pin 39) | <550 mV |
| VDD2 and VSS2 (pins 65 and 66) | PA7 (pin 64) | <1000 mV |
| VDDX and VSSX (pins 106 and 107) | PM0 (pin 105) | <850 mV |

The ranges shown in Table 1 were stored in a test program and used in the method of FIG. 1 to sort bad semiconductor units from good units. That is, the acceptable range of switching noise values were used as the predetermined data.

Referring now to FIG. 4, waveform diagrams illustrating the level of switching noise on a victim pin of a semiconductor device are shown. The waveform diagrams of FIG. 4 were obtained by performing a power and ground continuity test using the method shown in FIG. 1 on a microprocessor like the microprocessor 30 of FIG. 2. Two (2) signals are shown in FIG. 4: a first signal 36 shows the voltage level on the victim pin and the second signal 38 shows the voltage level on one of the aggressor pins. In the test performed, the IO pin PM0 adjacent the power and ground pair VDDX and VSSX was selected as the victim pin, and the IO pins PM1 and PM2 were selected as the aggressor pins. As shown in FIG. 4, the victim pin PM0 was held at a low state of 0 V, while the aggressor pins PM1 and PM2 were toggled simultaneously between a high state of 5 V and the low state of 0 V. As can be seen, the level of switching noise on the victim pin PM0 was measured when the aggressor pins PM1 and PM2 were toggled from the high state to the low state. In this test, the victim pin PM0 was found to have a maximum switching noise level of 920.0 millivolts (mV). As this value exceeds the acceptable range of switching noise values for the victim pin PM0 listed in Table 1, the semiconductor device of FIG. 2 is considered to have failed the power and ground continuity test and is sorted as a bad unit.

While various embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

The invention claimed is:

1. A method of testing for power and ground continuity of a semiconductor device, the device having a plurality of Input and Output (IO) pins and at least a pair of power and ground pins, the method comprising:

identifying the power and ground pins of the device;

selecting a victim pin from the IO pins of the device for each of the power and ground pins;

selecting at least one aggressor pin for each victim pin from the remaining IO pins;

toggling the aggressor pins between a first state and a second state;

measuring a level of switching noise on each victim pin; and comparing the measured levels of switching noise with predetermined data to determine power and ground continuity of the device.

2. The method of continuity testing of claim 1, wherein a plurality of aggressor pins is selected for each victim pin.

3. The method of continuity testing of claim 2, wherein the aggressor pins are toggled substantially simultaneously.

4. The method of continuity testing of continuity testing of claim 1, wherein the level of switching noise on each victim pin is amplified by the toggling of the aggressor pins.

5. The method of continuity testing of claim 1, wherein the level of switching noise on each victim pin is measured when the at least one aggressor pin is toggled from a high state to a low state.

6. The method of continuity testing of claim 5, wherein a maximum level of switching noise on each victim pin is measured.

7. The method of continuity testing of claim 1, wherein IO pins adjacent to the power and ground pins are selected as the respective victim pins.

8. The method of continuity testing of claim 7, wherein the power and ground pins are paired and one victim pin is selected for each power and ground pin pair.

9. The method of continuity testing of claim 1, wherein the victim pin is held at a fixed state.

10. The method of continuity testing of claim 1, wherein the predetermined data comprises switching noise measurements from at least one known good semiconductor device.

11. The method of continuity testing of claim 1, wherein the victim and aggressor pins are terminated with a terminating resistor.

12. The method of continuity testing of claim 11, wherein the terminating resistor has a resistance that matches a trace impedance of a load board on which the device is tested.

13. A method of testing for power and ground continuity of a semiconductor device, the device having a plurality of Input and Output (IO) pins and at least a pair of power and ground pins, the method comprising:
   identifying the power and ground pins of the device;
   selecting victim pins from the IO pins of the device for each of the power and ground pins;
   selecting at least one aggressor pin from the remaining IO pins;
   toggling the at least one aggressor pin between a high state and a low state;
   measuring a level of switching noise on the victim pins;
   comparing the measured level of switching noise with predetermined test data to determine continuity of the power and ground pins; and
   repeating the victim pin selecting step, the agressor pin selecting step, the toggling step, the measuring step and the comparing step for each power and ground pin.

14. The method of continuity testing of claim 13, wherein a plurality of aggressor pins is selected.

15. The method of continuity testing of claim 14, wherein the aggressor pins are toggled substantially simultaneously.

16. The method of continuity testing of claim 15, wherein the level of switching noise on the victim pin is measured when the aggressor pins are toggled from a high state to a low state.

17. The method of continuity testing of claim 13, wherein the respective victim pins are adjacent their corresponding ground and power pins.

18. The method of continuity testing of claim 13, wherein the predetermined data comprises switching noise measurements from at least one known good semiconductor device.

19. The method of continuity testing of claim 13, wherein the power and ground pins are paired and a victim pins are selected for each power and ground pin pair.

20. A computer readable medium tangibly embodying a program of instructions for power and ground continuity testing of a semiconductor device having a plurality of Input and Output (IO) pins and at least a pair of power and ground pins, the program to be stored in a memory and executed by a processor, the program comprising:
   instructions to identify the power and ground pins of the device;
   instructions to select a victim pin from the IO pins of the device for each of the power and ground pins;
   instructions to select at least one aggressor pin from the remaining IO pins for each victim pin;
   instructions to toggle the aggressor pins between a high state and a low state;
   instructions to measure a level of switching noise on each victim pin; and
   instructions to compare the measured levels of switching noise with predetermined data to determine power and ground continuity of the device.

* * * * *